(12) United States Patent
Morgana et al.

(10) Patent No.: US 9,158,875 B2
(45) Date of Patent: Oct. 13, 2015

(54) PACKAGE DEFINITION SYSTEM

(75) Inventors: Stephen C. Morgana, Rochester, NY (US); Reiner Eschbach, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 623 days.

(21) Appl. No.: 13/563,288

(22) Filed: Jul. 31, 2012

(65) Prior Publication Data
US 2014/0040319 A1 Feb. 6, 2014

(51) Int. Cl.
*B65B 61/18* (2006.01)
*G06F 3/0481* (2013.01)
*G06F 17/50* (2006.01)

(52) U.S. Cl.
CPC ............ *G06F 17/5068* (2013.01); *B65B 61/184* (2013.01); *G06F 3/0481* (2013.01); *G09G 2340/0407* (2013.01)

(58) Field of Classification Search
CPC .. B65B 61/186; B65B 61/184; B31D 1/0018; G06T 15/005; G06T 19/00; G06T 11/60; B65D 5/48012; B65D 5/4266; G09G 2340/0407; G06F 3/0481
USPC .................. 345/418, 419, 619, 660; 493/51; 229/100, 120.04; 53/410; 715/700, 764
See application file for complete search history.

(56) References Cited

U.S. PATENT DOCUMENTS

| | | | |
|---|---|---|---|
| 5,353,390 A | 10/1994 | Harrington | |
| 5,838,574 A | 11/1998 | Olson et al. | |
| 5,881,538 A | 3/1999 | Blohm | |
| 5,923,556 A | 7/1999 | Harris | |
| 6,090,027 A | 7/2000 | Brinkman | |
| 6,117,061 A | 9/2000 | Popat et al. | |
| 6,134,018 A | 10/2000 | Dziesietnik et al. | |
| 6,153,039 A | 11/2000 | Jacobsen | |
| 6,237,787 B1 | 5/2001 | Gallo et al. | |
| 6,243,172 B1 | 6/2001 | Gauthier et al. | |
| 6,409,019 B1 | 6/2002 | Hornsby et al. | |
| 6,689,035 B1 | 2/2004 | Gerber | |
| 6,953,513 B1 | 10/2005 | Volkert | |
| 7,013,616 B1 | 3/2006 | Powers et al. | |
| 7,366,643 B2 | 4/2008 | Verdura et al. | |
| 7,406,194 B2 | 7/2008 | Aizikowitz et al. | |
| 8,160,992 B2 | 4/2012 | Gombert et al. | |
| 8,170,709 B2 | 5/2012 | Puissant | |
| 2007/0041035 A1 | 2/2007 | Sembower et al. | |
| 2009/0278843 A1 | 11/2009 | Evans | |
| 2009/0282782 A1* | 11/2009 | Walker et al. | 53/410 |
| 2009/0287632 A1* | 11/2009 | Gombert et al. | 706/55 |
| 2010/0098319 A1 | 4/2010 | Gombert et al. | |
| 2010/0110479 A1* | 5/2010 | Gombert et al. | 345/419 |
| 2013/0120767 A1 | 5/2013 | Mandel et al. | |
| 2013/0120770 A1 | 5/2013 | Mandel et al. | |
| 2014/0038801 A1 | 2/2014 | Morgana et al. | |
| 2014/0038802 A1 | 2/2014 | Clark et al. | |
| 2014/0040319 A1 | 2/2014 | Morgana et al. | |
| 2014/0121800 A1 | 5/2014 | Morgana et al. | |
| 2014/0129018 A1 | 5/2014 | Morgana et al. | |
| 2014/0139849 A1 | 5/2014 | Eschbach et al. | |

* cited by examiner

FOREIGN PATENT DOCUMENTS

EP 621113 A1 10/1994
WO WO-2006108269 A1 10/2006

*Primary Examiner* — Chante Harrison
(74) *Attorney, Agent, or Firm* — Fox Rothschild LLP

(57) ABSTRACT

A package definition system enables a user to dynamically modify a package design by altering a dimension of less than all of the package's faces. The system uses a functional representation of a package having links and nodes that represent faces or functional elements and connecting relationships between them.

19 Claims, 15 Drawing Sheets

PACKAGE DEFINITION SYSTEM

RELATED APPLICATIONS

This patent application is related to U.S. patent application Ser. No. 13/563,071, filed Jul. 31, 2012, titled "Package Definition System."

BACKGROUND

When selecting a package for a manufactured product that is to be sold or shipped, product manufacturers and sellers typically must select a package from a specific inventory of available package sizes and shapes. However, this may result in a package that is not entirely suitable for the product. For example, when using a package that is larger than the product requires, additional packaging material may be needed to avoid damage to the product during handling. In addition, a larger package can require increased shipping and handling costs.

Thus, there has been significant interest in the manufacture of personalized packaging for small volume applications as they might arise from needing to add a secondary package around a primary package, from personalizing or customizing a primary or secondary package, from small test or sample runs, or from any other reason requiring short runs. However, current methods of making personalized packages are time consuming and require manipulation of machine parameters by experienced personnel. Thus, a user may only select from a limited number of templates. It is not easy for a novice user to create personalized packaging through a user interface.

In addition, automated package generation systems have limited variability. Although some package generation devices may produce packages from templates, the templates provide limited options. A very large number of templates would be required to enable a current package generation system to create, for example, a wide variety of package sizes.

This document describes systems and methods that present solutions to the problems discussed above, and which may also provide additional benefits.

SUMMARY

In an embodiment, a package definition system enables a user to dynamically modify a package design by altering a dimension of less than all of the package's facets. The system may include a processor, a user interface such as a display, and a memory containing programming instructions. When operating, the processor will retrieve, from a memory (which may be the same memory as that containing the programming instructions, or a different memory), a functional representation of a package. The package includes faces and functional elements. The functional representation includes a plurality of links and nodes, where each node represents one of the functional elements or one of the faces, and each link represents a connecting relationship between two of the nodes. The system will display or otherwise output a two-dimensional package flat based on the functional representation; identify a modified size of a selected one of the faces, identify the node that corresponds to the selected face; based on the link that corresponds to the identified node, identify a functional element having a connecting relationship with the selected face; and determine a modified functional element by modifying at least one of a number or a size of the functional element, based on the modified size of the selected face. The system also may create a data file of a modified two-dimensional package flat with data corresponding to the modified size of the selected facet and the modified functional element. It also may present, via the user interface, the modified two-dimensional package flat with the modified functional element and the modified size of the selected face.

Optionally, when determining the modified functional element, the system may identify a minimum size of the functional element, identify a desired size of the functional element, and determine whether the modified size of the selected face is sufficient to receive the functional element of the desired size, If the modified size of the selected face is sufficient to receive the functional element of the desired size, the system may assign the desired size to the modified functional element. If the modified size of the selected face is not sufficient to receive the functional element of the desired size, the system may determine whether the modified size of the selected face is sufficient to receive a functional element of the minimum size, and assign a size that is less than the desired size and at least as large as the minimum size to the modified functional element.

Optionally, when determining the modified functional element, the system may identify a minimum number of replications of the functional element, identify a desired size of the functional element, identify a desired spacing of the functional element, calculate an actual number of replications of the functional element that will fit on the face of the modified size, and determine whether the actual number of replications is at least as large as the minimum number of replications. If the actual number of replications is at least as large as the minimum number of replications, the system may assign the actual number of replications to the modified functional element. If the actual number of replications is at less than the minimum number of replications, the system may generate an alert.

Optionally, the system may include a package generation device that applies the data file to a rule set to impart a plurality of cut lines and fold lines to a substrate to yield the modified two-dimensional package flat.

DETAILED DESCRIPTION

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

Package production may be performed by a package generation system that is capable of performing printing operations on, and applying creases and cuts to, a substrate. The system also may perform other actions such as coating and/or stacking the substrate. Examples of automated package production system include those in the iGen™ series of digital production printing presses, available from Xerox Corporation, in connection with the corresponding finishing devices, one example being Stora Enso Gallop™. Other systems may include smaller printing devices, such as a Xerox DocuColor 250, or a digital cutter as offered by a variety of manufacturers such as Graphtec America, Inc. or Esko-Graphics, Inc. Typically, the substrate will be thicker than ordinary paper. For example, it may be cardboard, cardstock, or another material that will provide a self-supporting three-dimensional structure when folded into a package.

One aspect in the creation of the packages is that the printing device operates on a two dimensional sheet or "flat." The actual three-dimensional shape of the package is subsequently created through folding and connecting of the flat. This imposes a variety of restrictions on the structures both in its two dimensional form, as well as in its three dimensional form.

Figure 1:
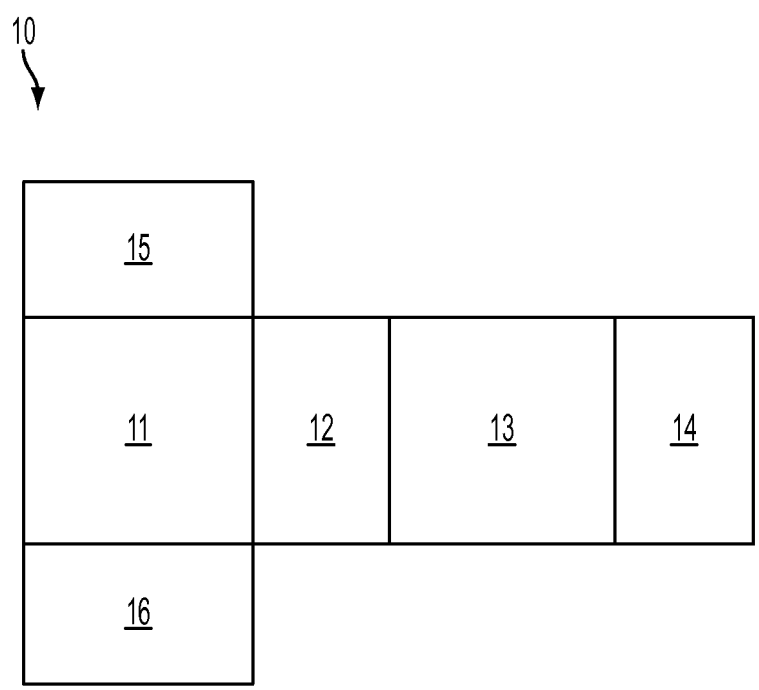
FIG. 1 depicts an example of faces that may make up a package.

FIG. 1 shows a common package flat 10, in this case a rectangular box, with a variety of faces 11-16 as they may be commonly envisioned by a human. Faces 15 and 16 can be thought of as top and bottom, though the actual three dimensional shape of the flat 10 is ambiguous. The ambiguity does not arise from the box geometry which is fully specified, but from functional box parameters. To form a three-dimensional package, the facets of FIG. 1 would have to be assembled and would use additional material or elements, examples of which will be described below in the context of FIG. 2. Note that faces 11 through 16 correspond to sides or faces of the intended three dimensional structure, but that the term facets is used more generically used throughout as any area of the two dimensional layout that may be delineated from other areas. Faces 11 through 16 may also be called shape elements in the subsequent description, indicating that scaling is performed in the common geometric approach either uniform or anamorphic.

Figure 2:
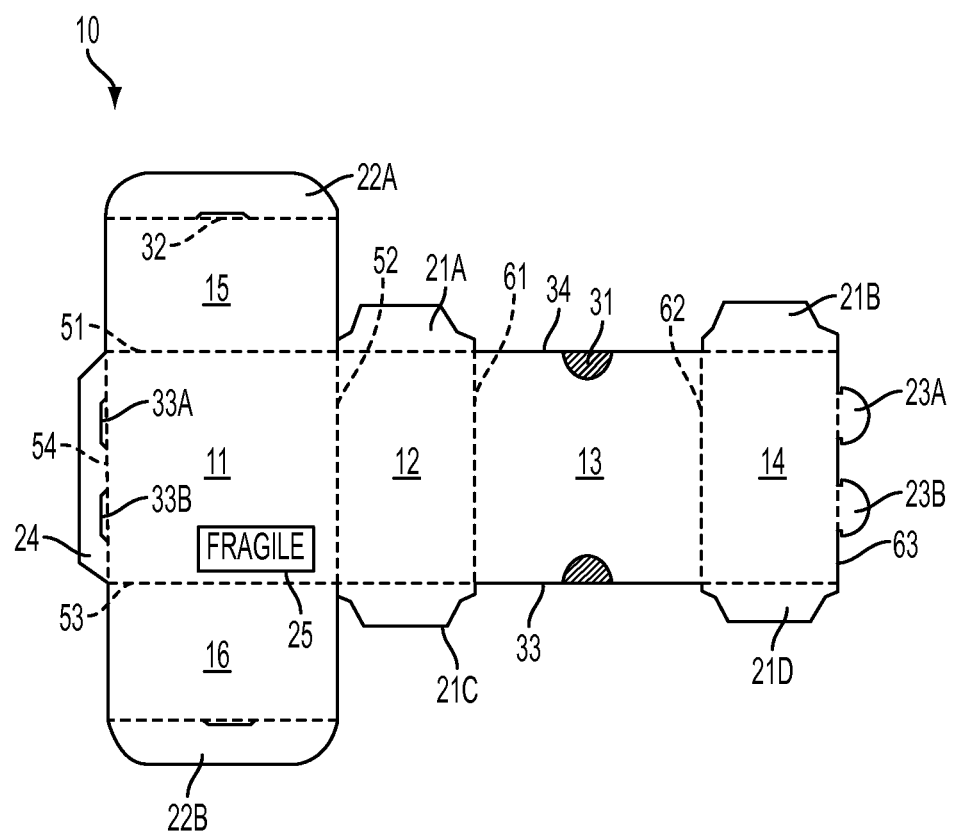
FIG. 2 depicts an example of a printed package flat.

FIG. 2 shows the same three dimensional geometric shape of FIG. 1 mapped to a workable flat 10 with faces 11 through 16 and functional elements representing removable connections. Functional elements are facets that have a functional property for the three dimensional structure, and may or may not be visible in the closed package. In general, functional elements are those facets that connect package faces, that influence the assembly of the package and/or that change a structural property of the assembled package as compared to the package flat. Examples of such properties include rigidity and dust protection. As used in this document, a "facet" may be a face and/or a functional element.

In FIG. 2, some functional elements include elements 22A, 22B and 21A-21D which may be referred to as lips or dust-flaps. Items 23A and 23B are locking tabs with facet 24 being a functional element by providing the needed material support for the actual receiving functional elements 33A and 33B. Elements 31 and 32 are two further functional elements modifying the physical properties of the three dimensional structure, in this case allowing an easier opening. Note that element 31 is a case where the functional element might become externally visible, in this case on its own or in the form of interconnecting element 22A.

Some facets may be partially a face and partially a functional element. An example is facet 13 which is a side but which also incorporates functional element 31. A face generally has no structure that is configured to be removably interconnected with another structure of the package, while a functional element does have such a structure. We thus will not label the faces of the assembled structure, nor the common boundaries between facets 11 and 12, 12 and 13, or 13 and 14 as functional elements in the description used here.

The methods described below focus on the functional elements, their dynamic nature and assembly, and on their influence on non-functional elements of the structure. The distinction of functional elements from structure faces allows a differentiated handling of the elements. For example, a change in size of the structure of a square or rectangular package, for simplicity assume a factor of two, will simply scale all sides by that factor. Functional elements on the other hand may or may not be scaled in that manner, for example a functional element may not be scaled if it would likely result in a lower quality three dimensional structure.

In the methods described below, assuming again the scaling of a factor of two, the functional elements need not be scaled but may instead undergo a logical operation, such as multiplication, addition, or subtraction. For example, in one embodiment, if the size of face 14 were increased, the functional elements 23A and 23B may be replicated to yield additional functional elements along edge 63. Each of the functional elements 23A . . . 23n may be identical in size, or their sizes may vary. In some embodiments, the functional elements may be substantially evenly spaced along edge 63. The number of functional elements added may vary based on the rules used by the applicable software. For example, the software may include algorithms indicating that each time the length of edge 63 increases by at least 40% over its original length, an additional functional element will be added. Or, as another example, the rule may require an additional functional element to be added for each 3 inches of length that are added. Other rules are possible.

Functional element 24 would also not be simply scaled, since the horizontal width can be maintained and only the vertical height changed on the two dimensional layout. However, the number and positions of functional elements 33A, 33B . . . 33n would change to correspond to their interlocking functional elements 23A, 23B . . . 23n. (In this description, the terms "horizontal" and "vertical" are used for illustration based on the orientation of package flat 10 in FIG. 2.) Functional element 22A would undergo a horizontal scaling, but no vertical scaling. Other functional elements, such as elements 31 and 32, may be related to ease of opening rather than structural support and this might be retained without any changes.

Conversely, if the structure is reduced by a factor of two, functional elements 23A and 23B may or may not be reduced in size. Rather, a rule-set would be used indicating the minimum number of tabs like 23A/23B and the minimal and maximal size of each. Functional elements 31 and 32 again may not be altered. In general, functional elements may be scaled under logical rules, where a base functional element is altered in size/shape in a minimal amount and the number of elements is adapted to the requirements.

Thus, as described above, when the size or scale of a shape element changes, the number and/or sizes of functional elements that are related to that shape element may automatically change. In addition, when a functional element moves, scales or replicates, that action may dynamically influence and modify the actual shape and content of other functional elements that are related but are not connected in the two dimensional flat. The rule-based scaling of the functional elements may be distinguished from the uniform or anamorphic scaling of the shape elements.

To explain the interdependency of the two dimensional layout and the three dimensional assembled structure, consider that side (face) 11 has four edges 51-54, each of which is interconnected to another facet by a fold, and none of the interconnecting facets may be removed without damaging the package. Similarly, side 13 has two edges 61 and 62 that are interconnected to other facets by folds. Side 13 also has two edges 33, 34 that may be positioned adjacent to a lips 22A and 22B when the package is folded. Although the two edges 33, 34 may initially appear to have no structure specifically configured to interconnect with lips 22A and 22B, when the package is folded each of the edges 33, 34 form part of an opening that receives a corresponding lip 22A or 22B. Each lip 22A, 22B has rounded edges and a creased edge that allow the lip it to be removably interconnected into the interior body of the package when folded.

The method of this disclosure changes the basic package description from a face or panel driven description to a functional element driven description. In that way, the package can dynamically changed at any stage in the design process, yielding very different geometries, but maintaining the underlying functional properties. This transition to a functional element description allows the independent treatment of "sides" or faces of the three dimensional structure and functional elements of the three dimensional structure. The functional element description explicitly encapsulates the difference in the neighborhood relationship of the two dimensional layout from the neighborhood relationship in the three dimensional structure.

Figure 3:
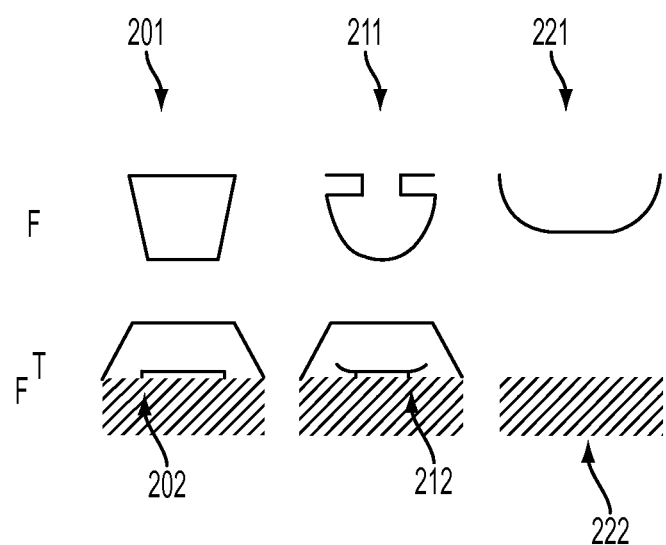
FIG. 3 illustrates examples of functional elements of a package.

Functional elements such as lips, tabs, receivers, spacers, and locking elements typically interconnect with other functional elements to provide closure, support and/or stability when the three-dimensional package is formed. Examples of functional element pairs are shown FIG. 3, with first functional elements F and their corresponding second functional elements $F^T$, each of which has a removably connectable relationship. In these examples the functional element pairs include a locking tab 211 and corresponding receiver 212 (which correspond to elements 23A and 33A of FIG. 2). The functional element pairs also include a sliding tab 201 and corresponding receiver 202, and a lip 221 and the corresponding receiver, in this case a NULL element (i.e., an open space, such as the "side" that corresponds to the opening of a bag), and neighboring face 222 that forms a portion of an opening.

A functional element may also define a secondary functional relationship, and multiple interlocking pieces may create a set of functional connections. For example, referring back to FIG. 2, consider a functional element pair $F_{15}|F_{13}$ to be the interconnect between facets 15 and 13. In the above notation, we would have $F_{15}$ being facet 22A, and $F_{13}$ being the functional element 31. In addition, secondary functional elements 21A and 21B function as dust protectors, and simultaneously as locking elements for facet 22A.

Returning to FIG. 2, when the device produces the flat 10 from a substrate, it will cut the substrate along one or more cut lines (represented as solid lines in FIG. 1, see, e.g., edge 34) and score, partially cut or impress the substrate along one or more fold lines (represented as dashed lines in FIG. 2, see, e.g., edge 61). The substrate also may include printed content 25 such as letters, numbers, graphics, barcodes, or other material that is printed on the substrate. Some or all of the printed content 25 may be printed on the substrate before the substrate enters the package production device.

The methods and systems described in this document develop a functional element-based representation for package designs that allow for a variety of package sizes and styles without the need for a large template library. The representation can be used to produce cut and fold commands for a knife-plotter based system, a die production system, or another package generation system.

Figure 4:
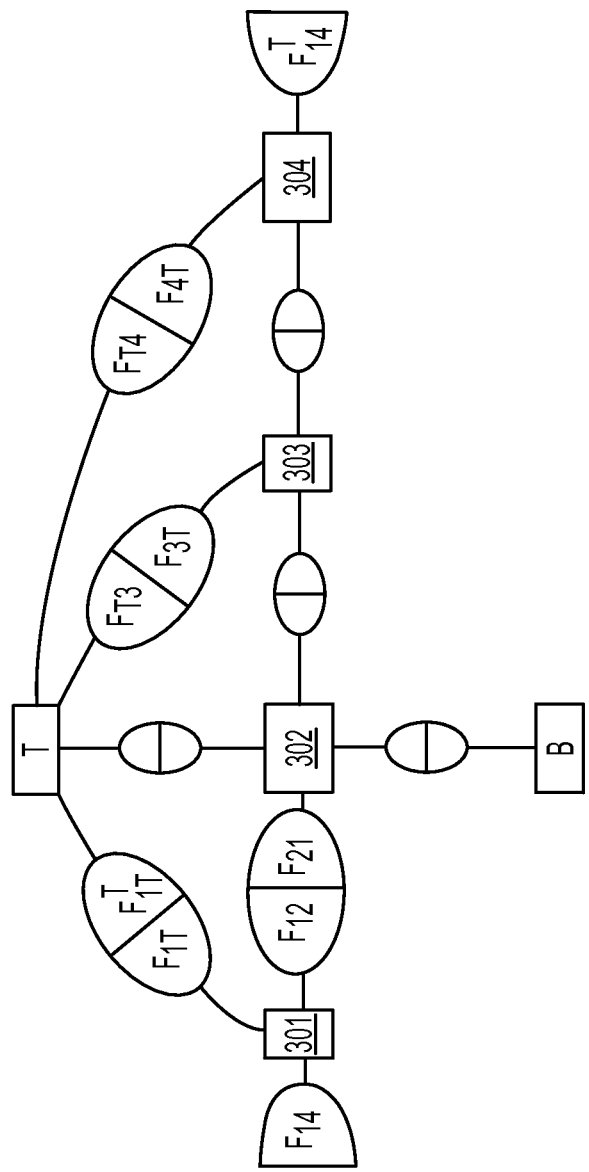
FIG. 4 illustrates a graph representation of a package.

FIG. 4 illustrates a preliminary stage of a graph representation of a package as a set of links and nodes. Nodes represent the shape elements or sides (B, T, and 301-304) or functional elements ($F_{14}$, $F_{14}^T$, etc.). Links represent connections between faces and/or functional elements, such as functional element links $F_{14}|F_{14}^T$, $F_{17}|F_{17}^T$, etc. Some functional elements may be explicit active elements of the graph, allowing functional element links to dynamically transform into optional nodes, into NULL elements, and to modify other elements, including shape elements as sides, as is the case for $F_{11,14}|F_{14,11}$ correspond to the elements that join facets 11 and 14 in FIG. 2, (as illustrated by elements by 23A, 23B, and 24, of FIG. 2). Note, that for simplicity of FIG. 4 not all functional element links connecting face "B" are shown. In addition, not all nodes have yet been defined in FIG. 4. For example, the nodes between faces 302 and 303 may be functional elements, folds, or something else.

Functional elements here and in the following discussion might again be a group of other functional elements, where the notation $F_{X,Y}$ normally indicates a complete functional element and a direct label. For example, "32" may indicate a specific element or sub-element. For example, in FIG. 2 functional element $F_{15,13}$ consists of functional elements 22A, 31 and 32 that are functionally connected, but which might be spatially disconnected in the two dimensional layout, as is the case with elements 31 and 32. Links describe the interconnected relationship between related functional element pairs. When stored in a data file, a node may contain dimension information, tag information that pertains to the function of the facet, and printable information such as associated text and/or image and print orientation. A link may contain general description information, such as a "fold." In addition or alternatively, the link may include more specific information about how a package generation device should create an edge to allow the connecting relationship, such as by applying a crease, a "kiss cut" or any other method. A link may include structural information in the form of a functional element link that will later be resolved into additional nodes and links until all remaining links are of a simple fold or dimension form.

Thus, a cut outline of the package may be comprised of the sides of the facets where no fold-edge connection exists, and the folds of the package are comprised of sides of facets walls where a fold-edge connection does exist. This geometry information may be used in a variable package layout as described below, as when a dimension of one edge is changed, the dimension of its corresponding edge may change, and more importantly, when a dimension of one edge is changed, new nodes and links are created that reflect the structural components of the package which can not be generated by a geometric scaling operation, as will be described later.

With a graph representation that incorporates nodes and functional element links (which this document may refer to as a functional element representation), a processor may create a rule set that includes instructions for applying cut and fold lines to define the functional elements and other elements of the package. The rule set may include instructions to alter the number and size/shape of functional elements or their components, to bind functional elements that are disjointed in a two-dimensional flat, but joined in a three-dimensional space and to create an outline cut. An example of an outline cut is shown by the outermost (solid) lines in the package flat 10 of FIG. 2. To produce the outline cut, the processor may first resolve all functional element links that map into nodes in the given the final package structure and dimensions, "walk" the graph representation by starting on any facet and selecting an edge that does not have a fold-connecting relationship to another facet. The system produces a cut command for that edge, and then follows adjacent edges in a clockwise direction, counter-clockwise direction, or another determined order for a sequence of adjacent non-fold edges, producing cut commands for them and continuing until it reaches an edge that has fold-connecting relationship with another facet. When that happens, the system steps in to that facet, and looks to the counter-clockwise adjacent edge, and proceeds as it did in the previous facet, producing cut commands for sequences of non-fold edges and stepping through to the connected facet for fold edges. This continues until it returns to the starting point. In that manner the system defines the cut commands for the outline of the box in a counter-clockwise order while stepping in an organized way through the graph. It should be noted that the invention is not limited to operation in a counter-clockwise direction, as it may move in a clockwise direction as well.

To generate fold line instructions and other cut line instructions, the system may analyze each facet. In addition or alternatively, it may analyze each edge that is not part of the outline cut. Facets that have fold-connecting edges may receive fold line commands with kiss cuts, fold knife or other fold options selected. Edges that are not fold-connecting may receive cut line commands. Other methods of generating cut line and fold line instructions may be used.

Figure 5:
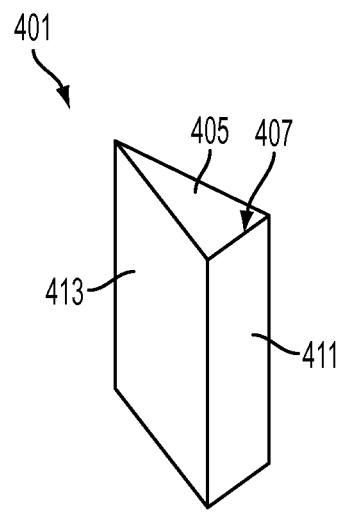
FIG. 5 illustrates an example of a three-dimensional package.

For example, FIG. 5 illustrates an example of a three-dimensional package 401. The production template for the package may include a rule set including cut instructions, fold instructions, and structural parameters such as shape and dimension information for the facets. For example, the rule set may indicate that the package's structural features will include a first face 411 having an edge 407 that is adjacent to and interconnected with a lid 405. The structural parameters may indicate that the lid 405 has a triangular shape. The structural parameters also may indicate that the first face 411 is rectangular with a height corresponding to an overall height (for example, a default of 10 cm) and a width corresponding to the width of the base of the triangular lid 405.

The processor may then determine, based on rules contained in the template, that the remaining structural features require two more facets 413 that are each adjacent to the first facet 411 along its 10-cm edge and adjacent to the lid 405 along the lid's two sides. The height of each side facet 413 would equal the total height (e.g., default of 10 cm), and the width of each side facet 413 would equal that of the adjacent lid.

Figure 6:
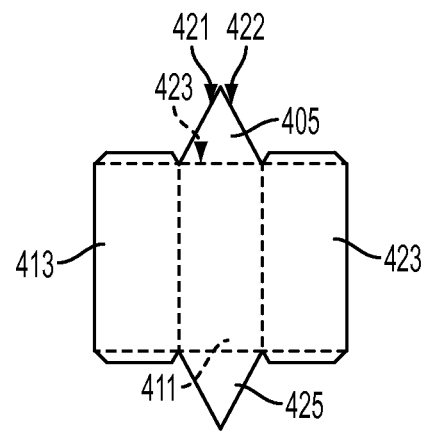
FIG. 6 shows a two-dimensional package flat that corresponds to the three-dimensional package of FIG. 5.

In addition, if the column is to be a closed column, the template may indicate that a second triangular facet having dimensions equal to those of the first triangular facet 405 should be provided. An example of how these features may be represented on a two-dimensional package flat is shown in FIG. 6. In addition to the features shown in FIG. 5, FIG. 6 also shows a second side facet 423 and a second triangular facet 425. Note that for illustrative purposes, not all links that correspond to functional element pairs have been resolved into nodes for display. In this case, only functional element links $F_{405|413}$, $F_{405|423}$, $F_{425|413}$ and $F_{425|423}$ have been mapped.

Figure 7:
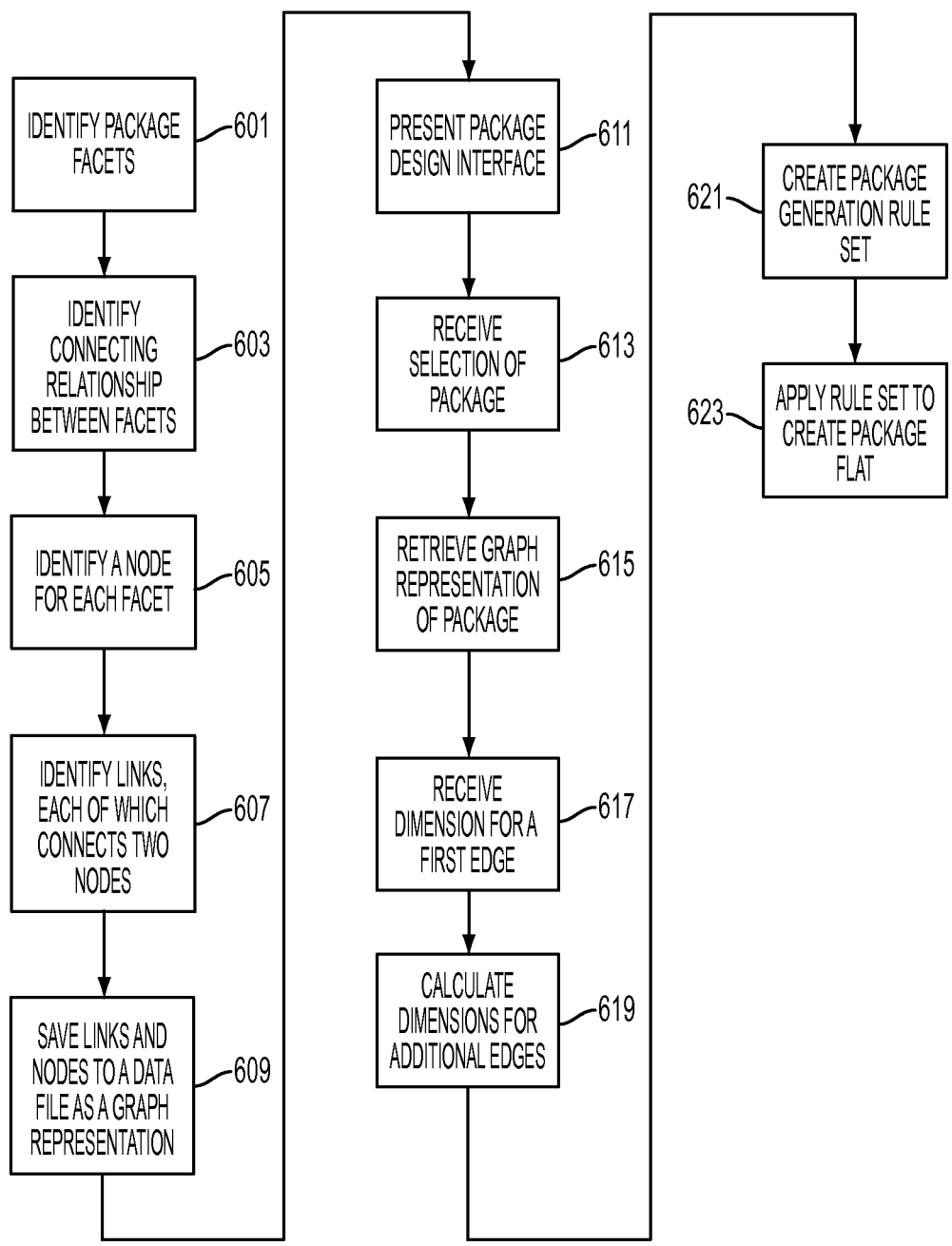
FIG. 7 is a flowchart of a package definition process.

FIG. 7 illustrates steps that a package definition system may follow when creating a graph representation of a three-dimensional package. The system may identify a set of facets for the package 601. Initially, each facet will be a face which will include a set of edges. For each edge, the system may identify a connecting relationship between the edge's facet and a different one of the faces 603. The system will then create a graph representation of the three dimensional package made up of links and nodes and introduce the functional element nodes that might or might not be mapped to facets, dependent on the functional layout of the package. In the initial stage, the dynamic graph will thus contain the nodes representing the facets of the package that are described as faces, plus a set of functional elements which might in a later stage be mapped to additional nodes connected by additional functional element links. The system will assign each node to a facet so that it represents the facet 605. The system will assign a link to each pair of nodes that have a connecting relationship between two of their edges 607. The system may then save the graph representation to a memory as a data file 609.

When a user seeks to design a package, the system may present a package design user interface to the user 611. The user may select a package 613 such as by specifying its template or generic structure, and the system will populate the graph representation with the nodes and links relevant to the desired structure and optionally display to the user a resolved graph with default sizes for the face elements of the desired structure that corresponds to the structure 615. The user will specify one or more dimensions 617, which may be newly-developed or predefined. The system will use the graph representation to determine dimensions for the other connected elements 619, be they direct, fold-linked, edges between shape elements or functional elements or be they "dimension relationship-linked" edges. Links that are dimension links are edges that, though not adjacent in the two dimensional flat, are adjacent, or otherwise related in a dimensional way in the 3D folded version of the package. For example, to start the dimension development process the system may identify a linked edge that has a connecting relationship with the user-specified edge, and determining a dimension for the linked edge based on the user-selected dimension for the user-specified edge. From that linked edge, the user dimension may be propagated further to other edges in the graph via links in the graph and by geometric symmetry within facets. By seeding user specified dimensions into the graph and then propagating the dimensions across links, the actual dimensions of all facet edges can be obtained.

In another step, the system will determine the specific structure of the functional elements based on the desired structure and based on the subsequently input size information from the links. This is done by visiting all links and resolving all links that are not simple "fold" or "dimension" links into their appropriate number of nodes and links based on the structural information and dimensional information. The system will then create a package generation rule set that includes the dimensions and structural parameters for each of the facets 621.

The rule set may include, for example, a set of cutting and/or scoring instructions that a package generating device may use to apply cut lines and/or fold lines to a substrate. The instructions may be saved to a computer readable memory such as a package generation file. The system may do this by retrieving a group of instructions for the edges of each facet from an instruction database, modifying groups as necessary based on each facet's relative position in the package, and then combining each retrieved group into an overall instruction set for the package flat. The instructions may include a series of instructions to either (a) apply a cut or fold line to the substrate, or (b) move the tool to a new position on the substrate without altering the substrate. For example, referring to FIG. 6, the instructions to create lid 405 may include instructions to: (1) move the cutter to the intersection of sides 421 and 423 of the lid; (2) apply a straight line cut from that point to the intersection of sides 421 and 422; (3) apply another straight line cut from that point to the intersection of sides 422 and 423; and (4) apply a straight line crease from that point to the intersection of sides 423 and 421. The system may determine whether a particular instruction for each facet edge (or portion thereof) should be a line or crease depending on whether that edge is an outer edge of the package flat (in which case a cut should be applied), or whether the edge is adjacent to another facet (in which case a crease should be applied).

Returning to FIG. 7, the system may then use a package generation device to apply the package generation rule set by imparting cut lines and fold lines to a substrate to yield a package flat 623. The package flat will include a facet with an edge that corresponds to the user-selected edge and user-specified dimensions. Other edges may have dimensions corresponding to those determined by the system.

Figure 8A:
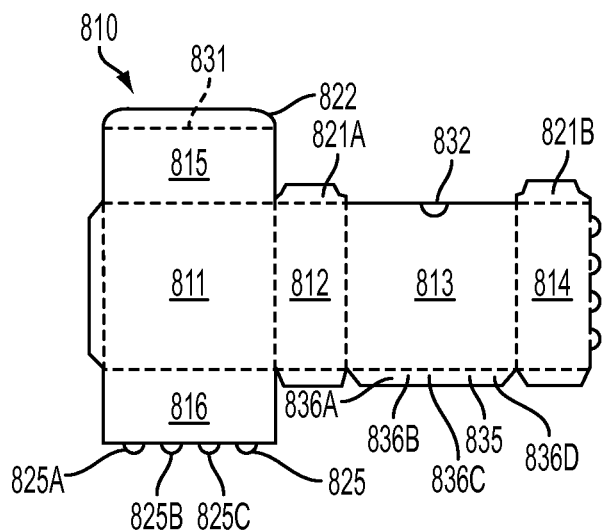
FIGS. 8A-8E illustrates various outcomes of a package scaling process.

FIGS. 8A-E illustrate the basic attributes of the separation of functional elements from the standard shape elements, and how the user interface of a system embodiment may display the changing dimensions and functional elements of the package flat when one or more facets are resized. More importantly, even if the user is not exposed to the actual functional elements in the user interface, the functional elements are nevertheless present on the two dimensional flat that will be used in producing the three dimensional structure. FIG. 8A illustrates a two dimensional package flat 810 that represents a three dimensional shape of equal width and height (facet 811) and smaller depth (facet 812). Facet 813 inherits the dimensions of facet 811, while facet 814 inherits the dimensions of facet 812 in a standard geometric way. In FIG. 8A the three dimensional structure includes a lid (facet 815), functional element 822 as a lip, and functional element 832 as part of a thumb catch. A locking bottom (facet 816) has functional elements 825A-825D as locking tabs, as well as corresponding receptacles 836A-836D positioned on facet 835. Note that functional element 832 also relates to functional element 831, despite not being adjacent on the two dimensional layout. Note that the functional elements each correspond to functional element links. For example, functional element link $F_{815|812}$ was rendered to facet/node 821A and two new functional element links $F_{815|8214}$ and $F_{812|8214}$, with the first one being a simple "dimension" link and the second being a simple "fold" link not requiring further resolution.

Figure 8B:
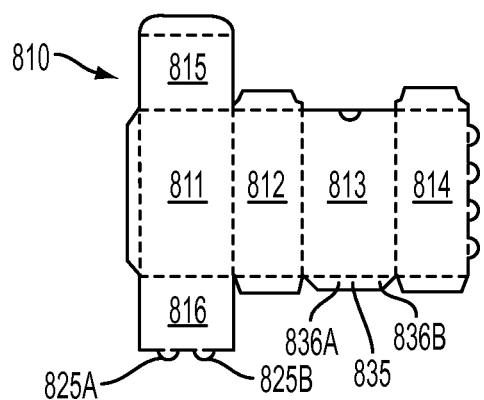

Assuming this basic geometry, the size of various facets of package flat 810 might now be changed as shown in FIG. 8B, reducing the width of facet 811. This has the geometric implication on the shape elements which are scaled in a geometric fashion. Functional element link $F_{816|813}$, however is not geometrically scaled but undergoes a rule based change in the form of changing the number of locking tabs after functional element link resolution. The locking tabs 825A and 825B are not geometrically scaled, but rather are rule-based scaled, as the total number of locking tabs is reduced from four to two. The corresponding receptacles 836A and 836B are dynamically modified accordingly. Note that the base graph of FIGS. 8A and 8B are identical prior to the final step of resolving all functional element links that have to be converted into nodes, leaving only "fold" and "dimension" links, i.e. FIGS. 8A and 8B are completely represented by the structure of FIG. 4. The two graphs after resolving all relevant functional element links are distinct and vary in their number of nodes, links and facets.

Assuming a different geometry change as in FIG. 8C, we again see that the shape elements undergo a standard geometric scaling, whereas the functional elements undergo a rule-based modification, i.e. functional element links $F_{816|813}$ and $F_{811|814}$ have been resolved into new nodes and links through a rule based modification. Compared to the scale of FIG. 8B, in FIG. 8C the number of tabs 825A-825C along facet 816 has been increased to three, while the number of tabs 823A-823B along facet 814 has been reduced to three. The corresponding receiving functional elements are not shown here for simplicity, but follow directly from functional element facet 24 of FIG. 2.

Figure 8C:
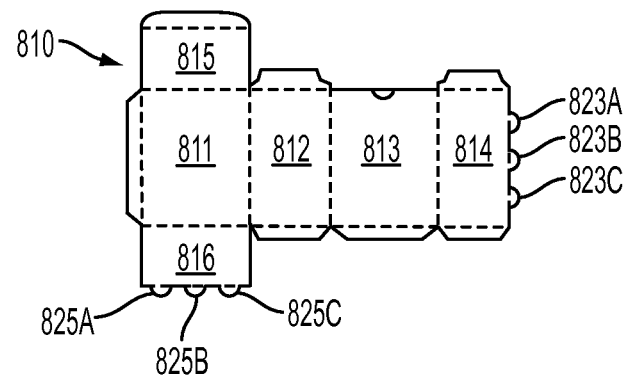
Figure 8D:
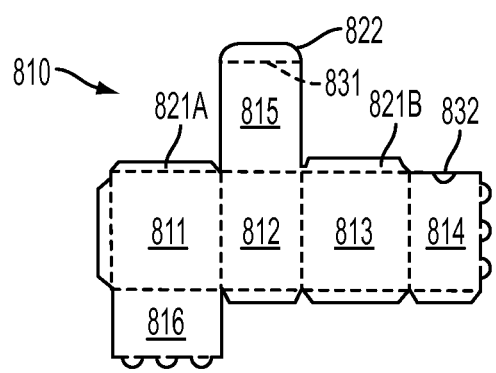

Another modification is shown in FIG. 8D where the shape is maintained, but the package lid 815 was moved to be adjacent to facet 812. This directly influences all functional elements that are functionally connected to facet 815. Thus lips 821A and 821B are correspondingly moved, as well as functional elements 822, 831, and 832. Note that the concentration on the functional element links in the representation of the structure allows a seamless transformation without any required user interaction. Again, the graphs of FIGS. 8C and 8D start from the same initial graph and after resolution of the Functional Element Links have, in this example, an identical number of nodes, but a different connecting relationship through "fold" and "dimension" links that are the result of the resolution.

Yet another modification is shown in FIG. 8E, where again the shape of the three dimensional structure is maintained, but the functional parameters and thus functional elements are changed. The lid 815 was moved further, again moving all functional elements 821A, 821B, 822, 831 and 832. Additionally, the bottom 816 has been changed functionally to be able to be opened, changing functional element $F_{16,13}$ to eliminate functional elements formerly shown as 825A . . . 825n and add functional elements 821B, 831B and 832B.

Figure 8E:
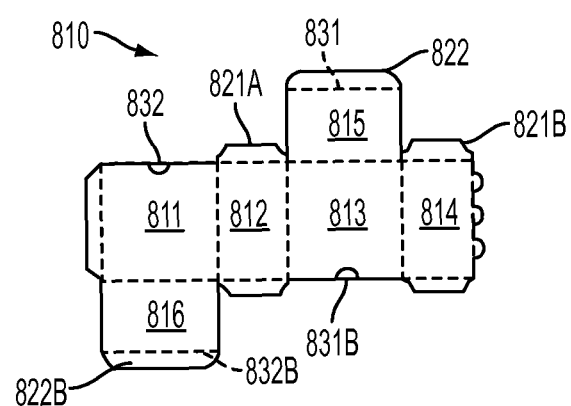

Note that FIGS. 8C-8E all describe three-dimensional packages having the same physical shape, but with different functional structures. They are all represented by the same number of nodes and links.

Figure 9:
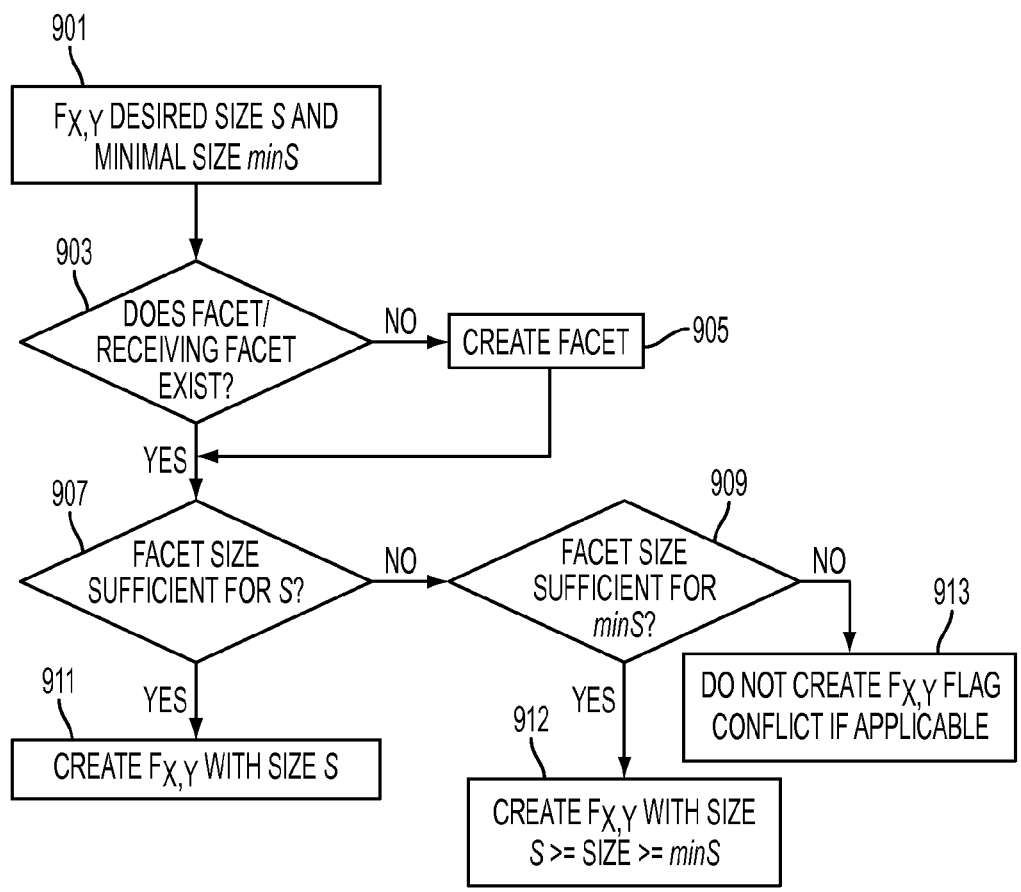
FIG. 9 illustrates a process of adjusting the scale of a package functional element.
Figure 10:
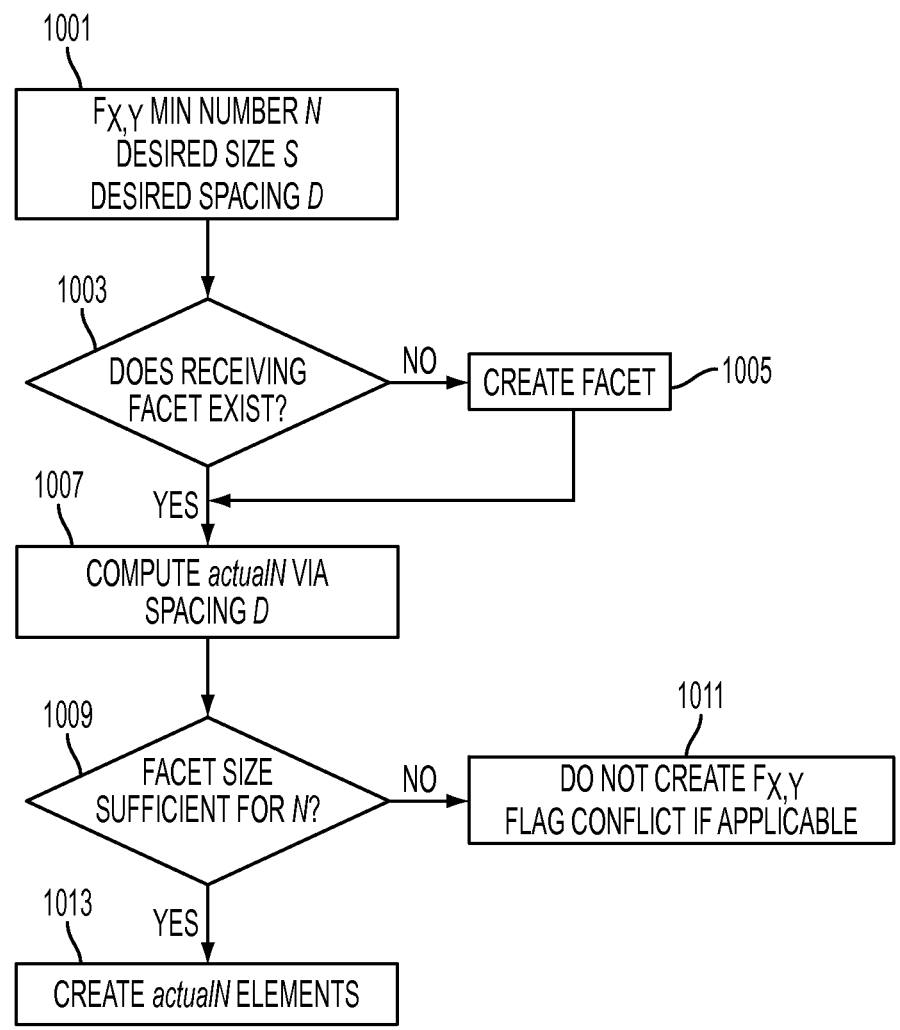
FIG. 10 illustrates a process of adjusting the number of functional elements used as the scale of a package changes.

A process for rule-based scaling of the functional elements is illustrated in FIGS. 9 and 10. For simplicity, we are only considering a subset of the parameters in FIGS. 9 and 10 with the two examples concentrating on different aspects. In FIG. 9. we retrieve a functional representation of a package flat that includes a potential functional element of a desired size 901, for example a thumb catch. The system determines whether the functional element's corresponding facet exists 903, including potentially receiving facets. If not, the corresponding facet or facets are created 905. Note that aspects of the facet size might be directly or indirectly related to the shape parameters.

The system then determines whether the resulting facet's size is sufficient to receive/hold the desired size S of the functional element 907. If so, the system will insert the functional element on or along the facet by creating the functional element with the size S 911. If shape restrictions of the facet allow a smaller size, it is verified if this smaller size is still larger than the minimal functional element size minS 909. The maximum possible size of the element is then created as long as it is above the required minimal size minS 912. If not, the element is not created and the conflict may flagged for review by a system user 913.

FIG. 10 illustrates a process whereby a functional element influences the physical properties of other elements like locking tabs, etc. In this process, the system again retrieves a functional representation of a package flat that includes a potential functional element of a desired size 1001, along with the default or minimum number of such elements N and a spacing dimension D indicating how far apart—or where along an edge—the elements should be placed (for example elements 23A and 23B in FIG. 2). The system determines whether the face/receiving facet exists 1003 (for example facet 54 in FIG. 2) and if not it creates the facet in the functional representation 1005. Based on the size of the facet and desired spacing D, the system determines how many facets (actualN) will fit within the available space using an algorithm such as actualN=facet size/D (for example facet 825 of FIG. 8). Given the desired spacing between elements, the system determines whether the actual number the facet can hold is a sufficient number of elements N 1009. If so, it will create the determined number of elements actualN in the functional representation 1013 (as for example the functional elements 823 and 825 throughout FIG. 8). If not, it may flag the facet for conflict 1011 for a user to review, or it may automatically increase a size of the facet to allow for the minimum number of elements to be included.

Figure 11A:
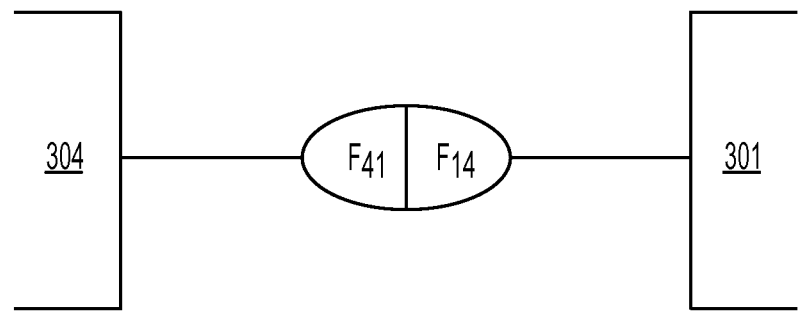
FIGS. 11A-11C illustrate an example of functional elements and their links being mapped to nodes and simple fold or dimension links.
Figure 11B:
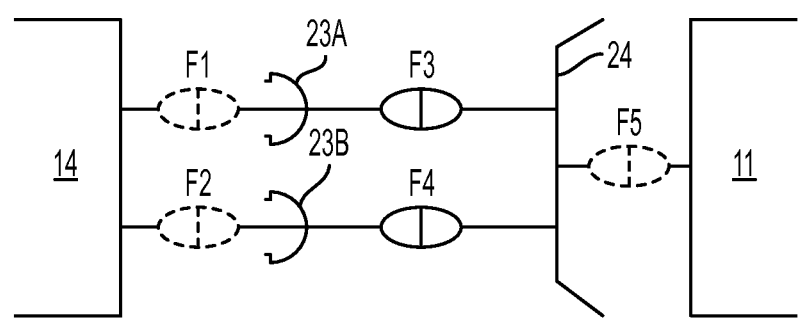
Figure 11C:
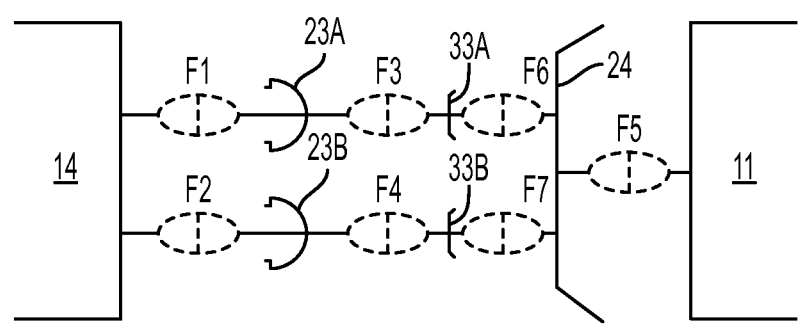

FIGS. 11A through 11C further illustrate the above described methods for transforming 304, $F_{14|41}$, 301 of FIG. 2 into elements 23A, 23B, 24, 33A, 33B of FIG. 4. In step 621 of FIG. 7, it was determined that functional element link $F_{14|41}$ is intended to be a locking tab. Following the size definitions, it is decided following FIG. 10 that two tabs should be used. This leads to the creation of the two locking tabs 23A, 23B and the receiving facet 24. It is known that the functional element links connecting face 304 with functional elements 23A, 23B, as well as the link connecting 301 with 24, are "fold" links or "dimension" links. This is indicated in FIGS. 11B and 11C by using a dotted line for the representation of F1, F2, F5. Step 612 further determines that the functional element links F3, F4 connecting functional elements 23A, 23B and 24 require the creation of the receiving elements 33A, 33B, as well as creating the new links F6, F7, which in this example are simple "fold" or "dimension" links, as shown in FIG. 11C. At this stage, the functional element link $F_{14|41}$ has been completely resolved and the initial dynamic graph from FIG. 4 has been turned into the actual structure representation that is executed to generate the cut, fold, etc. commands. It is understood that the resolution of Functional Element Links as outlined in FIG. 11 often allows a different processing order for some or all steps, not changing the basic inventive method.

Figure 12A:
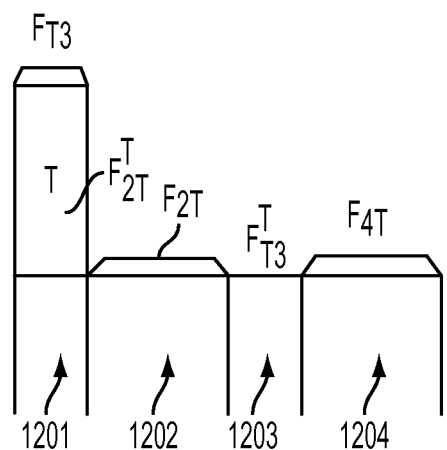
FIGS. 12A-12D illustrate various examples of interconnected elements of packages.
Figure 12B:
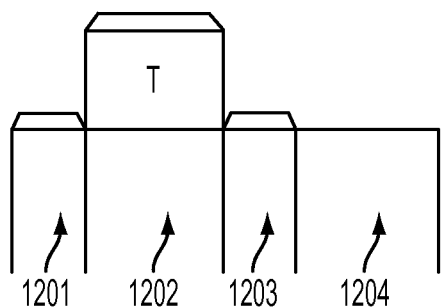

FIGS. 12A-12D illustrate another example of how dimensions and structural parameters may be determined in a dynamic manner for facets having interconnected edges. In the graph representation, we can see that nodes that have walls connected by fold-edges typically have the same wall length on each side of the edge. For example, in FIG. 12A, facets 1201-1204 represent sides of a box, and facet T represents a top of the box. Side 1202 is connected to a functional element $F_{2T}$ that, when the box is folded, may be adhered to a side $F^T_{2T}$ of the top. If the width of side 1202 (corresponding to $F_{2T}$) is changed, then the height of corresponding top side $F^T_{2T}$ also must be changed to match the new dimension of side 1202. On the other hand, if the interconnecting relationship between top T and side 1202 is changed from a fold-edge relationship to an adjacent edge relationship as shown in FIG. 12B, then fold-edge relationships must be established on sides 1201 and 1203.

Figure 12C:
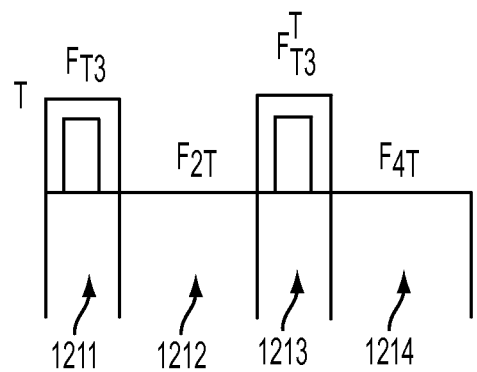
Figure 12D:
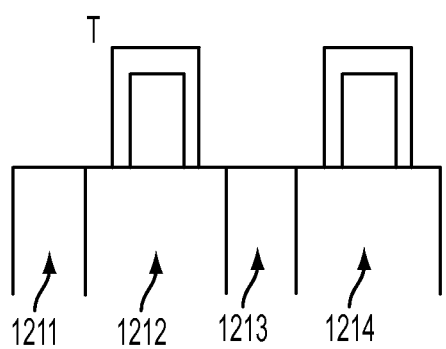

FIGS. 12C and 12D illustrate an option where the top T is an actual handle, such as may be found in a bag or open-topped box with handles. In this situation, $F_{T3}$ and/or $F_{T3}^T$ may be NULL elements, or they may simply have the same physical properties as T. The rule set may be such that if the handles are moved from sides 1211 and 1213 (FIG. 12C) to sides 1212 and 1214 (FIG. 12D), no dimensional adjustments are necessary so long as the new sides 1212 and 1214 are at least the same width as the original sides 1211 and 1213.

Figure 13:
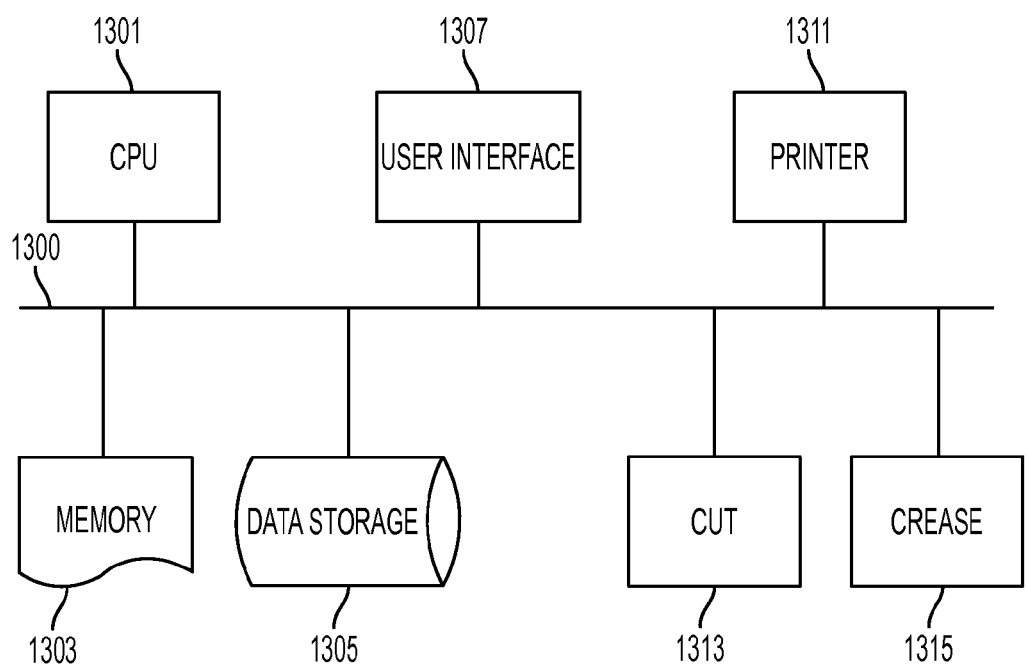
FIG. 13 is a block diagram showing various equipment that may be used to implement various embodiments of the processes described in this document.

FIG. 13 depicts a block diagram of hardware and/or electronics that may make up a package definition and/or production system. One or more communications lines 1300 such as a bus or network interconnect the illustrated components and allow data and/or signals to flow between the components. CPU 1301 is a processor that performs calculations and logic operations required to execute a program. Any number of processors may be available, and they may access a computer-readable memory device 1303 containing programming instructions, along with a data storage facility 1305 such as a database that stores the package generation templates and/or rule sets.

A user interface 1307 provides output to, and receives input from, a user. The user interface may include a display, audio output, a printer, or another element that provides information to a user. The user interface 1307 also may include a touch-sensitive component, microphone, audio port, keyboard, mouse, touch pad, or other input mechanism that is capable of receiving user input.

The system also may include a package generation device, which may include some or all of the following elements: a printer 1311, a knife or other cutting device 1315, and a roller or other device 1315 capable of imparting a crease in a substrate.

The features and functions disclosed above, as well as alternatives, may be combined into many other different systems or applications. Various presently unforeseen or unanticipated alternatives, modifications, variations or improvements may be made by those skilled in the art, each of which is also intended to be encompassed by the disclosed embodiments.

The invention claimed is:

1. A package definition system, comprising:
a processor;
a display; and
a memory containing programming instructions that, when executed, instruct the processor to:
retrieve, from a memory, a functional representation of a package, wherein the package includes a plurality of faces and functional elements, the functional representation comprising a plurality of links and nodes, each node representing one of the functional elements or one of the faces, and each link representing a connecting relationship between two of the nodes,
display, on the display, a two-dimensional package flat based on the functional representation,
identify a modified size of a selected one of the faces,
identify the node that corresponds to the selected face,
based on the link that corresponds to the identified node, identify a functional element having a connecting relationship with the selected face,
determine a modified functional element by modifying at least one of a number or a size of the functional element, based on the modified size of the selected face;

create a data file of a modified two-dimensional package flat with data corresponding to the modified size of the selected face and the modified functional element; and displaying, on the display, the modified two-dimensional package flat with the modified functional element and the modified size of the selected face.

2. The package definition system of claim 1, wherein the instructions that instruct the processor to determine the modified functional element comprise instructions to:
identify a minimum size of the functional element;
identify a desired size of the functional element; and
determine whether the modified size of the selected face is sufficient to receive the functional element of the desired size.

3. The package definition system of claim 2, wherein the instructions that instruct the processor to determine the modified functional element also comprise instructions to, if the modified size of the selected face is sufficient to receive the functional element of the desired size, assign the desired size to the modified functional element.

4. The package definition system of claim 1, wherein the instructions that instruct the processor to determine the modified functional element also comprise instructions to, if the modified size of the selected face is not sufficient to receive the functional element of the desired size:
determine whether the modified size of the selected face is sufficient to receive a functional element of the minimum size; and
assign a size that is less than the desired size and at least as large as the minimum size to the modified functional element.

5. The package definition system of claim 1, wherein the instructions that instruct the processor to determine the modified functional element comprise instructions to:
identify a minimum number of replications of the functional element;
identify a desired size of the functional element;
identify a desired spacing of the functional element;
calculate an actual number of replications of the functional element that will fit on the face of the modified size; and
determine whether the actual number of replications is at least as large as the minimum number of replications.

6. The package definition system of claim 5, wherein the instructions that instruct the processor to determine the modified functional element also comprise instructions to, if the actual number of replications is at least as large as the minimum number of replications, assign the actual number of replications to the modified functional element.

7. The package definition system of claim 5, wherein the instructions that instruct the processor to determine the modified functional element also comprise instructions to, if the actual number of replications is less than the minimum number of replications, generate an alert.

8. The package definition system of claim 1, further comprising instructions that, when executed, cause a package generation device to apply the data file to a rule set to impart a plurality of cut lines and fold lines to a substrate to yield the modified two-dimensional package flat.

9. A package definition system, comprising:
a processor;
a user interface; and
a memory containing programming instructions that, when executed, instruct the processor to:
identify a functional representation of a package, wherein the package includes a plurality of faces and functional elements, the functional representation comprising a plurality of links and nodes, each node representing one of the functional elements or one of the faces, and each link representing a connecting relationship between two of the nodes,
cause the user interface to present a two-dimensional package flat based on the functional representation,
identify a modified size of a selected one of the faces,
identify the node that corresponds to the selected face,
based on the link that corresponds to the identified node, identify a functional element having a connecting relationship with the selected face,
determine a modified functional element by modifying at least one of a number or a size of the functional element, based on the modified size of the selected face;
creating a data file of a modified two-dimensional package flat with data corresponding to the modified size of the selected face and the modified functional element; and
cause the user interface to present the modified two-dimensional package flat with the modified functional element and the modified size of the selected face.

10. The package definition system of claim 9, wherein the instructions that instruct the processor to determine the modified functional element comprise instructions to:
identify a minimum size of the functional element;
identify a desired size of the functional element;
determine whether the modified size of the selected face is sufficient to receive the functional element of the desired size;
if the modified size of the selected face is sufficient to receive the functional element of the desired size, assign the desired size to the modified functional element; and
if the modified size of the selected facet is not sufficient to receive the functional element of the desired size:
determine whether the modified size of the selected face is sufficient to receive a functional element of the minimum size; and
assign a size that is less than the desired size and at least as large as the minimum size to the modified functional element.

11. The package definition system of claim 9, wherein the instructions that instruct the processor to determine the modified functional element comprise instructions to:
identify a minimum number of replications of the functional element;
identify a desired size of the functional element;
identify a desired spacing of the functional element;
calculate an actual number of replications of the functional element that will fit on the face of the modified size; and
determine whether the actual number of replications is at least as large as the minimum number of replications.

12. The package definition system of claim 11, wherein the instructions that instruct the processor to determine the modified functional element also comprise instructions to:
if the actual number of replications is at least as large as the minimum number of replications, assign the actual number of replications to the modified functional element; and
if the actual number of replications is less than the minimum number of replications, generate an alert.

13. A method of defining a package, comprising:
by a processor, identifying a functional representation of a package, wherein the package includes a plurality of faces and functional elements, the functional representation comprising a plurality of links and nodes, each node representing one of the functional elements or one of the faces, and each link representing a connecting relationship between two of the nodes, causing a package design user interface to present a two-dimensional package flat to a user based on the functional representation, identifying a modified size of a selected one of the faces, identifying the node that corresponds to the selected face, using the link that corresponds to the identified node, to identify a functional element having a connecting relationship with the selected face, determining a modified functional element by modifying at least one of a number or a size of the functional element, based on the modified size of the selected face;

creating a data file of a modified two-dimensional package flat with data corresponding to the modified size of the selected face and the modified functional element; and causing the package design user interface to present the modified two-dimensional package flat with the modified functional element and the modified size of the selected face to be presented to the user.

14. The method of claim 13 wherein determining the modified functional element comprises:
   identifying a minimum size of the functional element;
   identifying a desired size of the functional element; and
   determining whether the modified size of the selected face is sufficient to receive the functional element of the desired size.

15. The method of claim 14 wherein, if the modified size of the selected face is sufficient to receive the functional element of the desired size, determining the modified functional element comprises assigning the desired size to the modified functional element.

16. The method of claim 14 wherein, if the modified size of the selected face is not sufficient to receive the functional element of the desired size, determining the modified functional element comprises:
   determining whether the modified size of the selected face is sufficient to receive a functional element of the minimum size; and
   assigning a size that is less than the desired size and at least as large as the minimum size to the modified functional element.

17. The method of claim 13 wherein determining the modified functional element comprises:
   identifying a minimum number of replications of the functional element;
   identifying a desired size of the functional element;
   identifying a desired spacing of the functional element;
   calculating an actual number of replications of the functional element that will fit on the facet of the modified size; and
   determining whether the actual number of replications is at least as large as the minimum number of replications.

18. The method of claim 17 wherein determining the modified functional element comprises:
   if the actual number of replications is at least as large as the minimum number of replications, assigning the actual number of replications to the modified functional element; and
   if the actual number of replications is less than the minimum number of replications, generating an alert.

19. The method of claim 17, further comprising, by a package generation device, applying the data file to a rule set to impart a plurality of cut lines and fold lines to a substrate to yield the two-dimensional package flat.

* * * * *